(12) United States Patent
Wang et al.

(10) Patent No.: US 12,575,174 B2
(45) Date of Patent: Mar. 10, 2026

(54) INTEGRATED CIRCUIT HAVING TRANSISTORS WITH DIFFERENT WIDTH SOURCE AND DRAIN TERMINALS

(71) Applicants: TAIWAN SEMICONDUCTOR MANUFACTURING COMPANY, LTD., Hsinchu (TW); TSMC NANJING COMPANY, LIMITED, Nanjing (CN); TSMC CHINA COMPANY, LIMITED, Shanghai (CN)

(72) Inventors: Xinyong Wang, Hsinchu (TW); Cun Cun Chen, Hsinchu (TW); Ying Huang, Hsinchu (TW); Chih-Liang Chen, Hsinchu (TW); Li-Chun Tien, Hsinchu (TW)

(73) Assignees: TAIWAN SEMICONDUCTOR MANUFACTURING COMPANY, LTD, Hsinchu (TW); TSMC CHINA COMPANY, LIMITED, Shanghai (CN); TSMC NANJING COMPANY, LIMITED, Nanjing (CN)

( * ) Notice: Subject to any disclaimer, the term of this patent is extended or adjusted under 35 U.S.C. 154(b) by 569 days.

(21) Appl. No.: 18/152,007

(22) Filed: Jan. 9, 2023

(65) Prior Publication Data

US 2024/0088147 A1    Mar. 14, 2024

(30) Foreign Application Priority Data

Sep. 9, 2022    (CN) .......................... 202211101953.8

(51) Int. Cl.
| | |
|---|---|
| *H10D 84/85* | (2025.01) |
| *H01L 23/522* | (2006.01) |

(Continued)

(52) U.S. Cl.
CPC ......... *H10D 84/85* (2025.01); *H01L 23/5226* (2013.01); *H01L 23/5286* (2013.01); *H10D 84/0186* (2025.01); *H10D 84/038* (2025.01)

(58) Field of Classification Search
CPC .. H10D 84/85; H10D 84/0186; H10D 84/038; H10D 84/853; H10D 30/62;
(Continued)

(56) References Cited

U.S. PATENT DOCUMENTS

| | | | |
|---|---|---|---|
| 2017/0373065 A1* | 12/2017 | Okagaki | ................ H10D 89/10 |
| 2019/0065650 A1 | 2/2019 | Pelloie | |

(Continued)

FOREIGN PATENT DOCUMENTS

| | | |
|---|---|---|
| TW | 201715651 | 5/2017 |
| TW | 201917857 | 5/2019 |

(Continued)

*Primary Examiner* — Galina G Yushina
(74) *Attorney, Agent, or Firm* — Hauptman Ham, LLP

(57) ABSTRACT

An integrated circuit includes a first terminal-conductor, a second terminal-conductor, and a gate-conductor between the first terminal-conductor and the second terminal-conductor. The first terminal-conductor intersects both an active-region structure and a power rail. The second terminal-conductor intersects the active-region structure without intersecting the power rail. The gate-conductor intersects the active-region structure and is adjacent to the first terminal-conductor and the second terminal-conductor. A first width of the first terminal-conductor is larger than a second width of the second terminal-conductor by a predetermined amount.

20 Claims, 14 Drawing Sheets

(51) Int. Cl.
  *H01L 23/528* (2006.01)
  *H10D 84/01* (2025.01)
  *H10D 84/03* (2025.01)

(58) Field of Classification Search
  CPC .. H10D 89/10; H10D 30/6219; H10D 62/118;
       H10D 62/119; H01L 2924/14; H01L
       23/5226; H01L 23/5286
  See application file for complete search history.

(56) References Cited

U.S. PATENT DOCUMENTS

| | | | |
|---|---|---|---|
| 2020/0257842 A1 | 8/2020 | Hsieh et al. | |
| 2021/0384351 A1 | 12/2021 | Chen et al. | |
| 2022/0114320 A1* | 4/2022 | Yu | H10D 89/10 |
| 2022/0130968 A1 | 4/2022 | Peng et al. | |
| 2022/0375963 A1* | 11/2022 | Lee | H10D 84/907 |
| 2023/0101678 A1* | 3/2023 | Chu | H10D 89/10 |
| | | | 716/119 |
| 2023/0125996 A1* | 4/2023 | Lee | H10D 89/10 |
| | | | 257/207 |

FOREIGN PATENT DOCUMENTS

| | | |
|---|---|---|
| TW | 201947726 | 12/2019 |
| TW | 202141729 | 11/2021 |
| TW | 202205133 | 2/2022 |
| TW | 202209627 | 3/2022 |

* cited by examiner

500

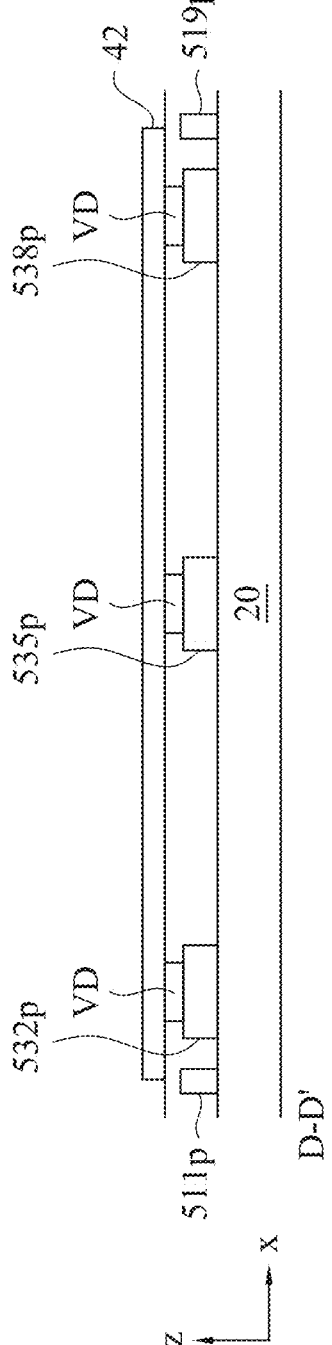
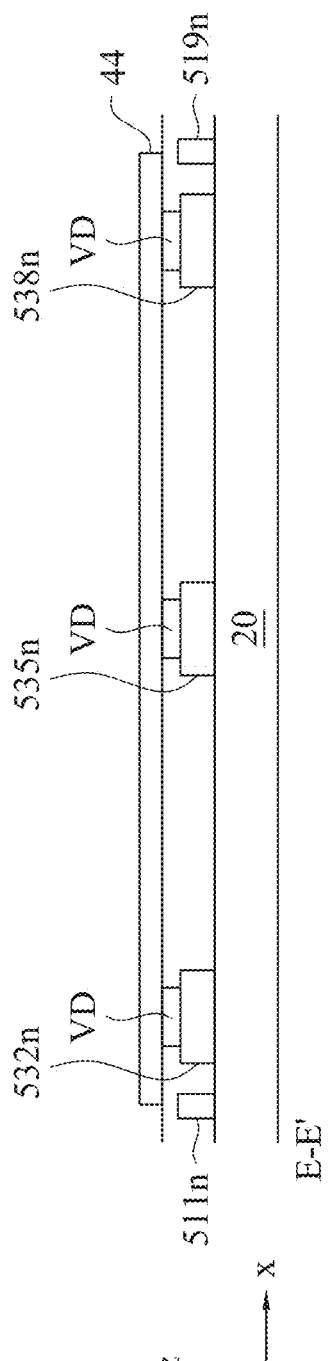
FIG. 5C

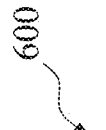
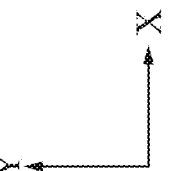
FIG. 6

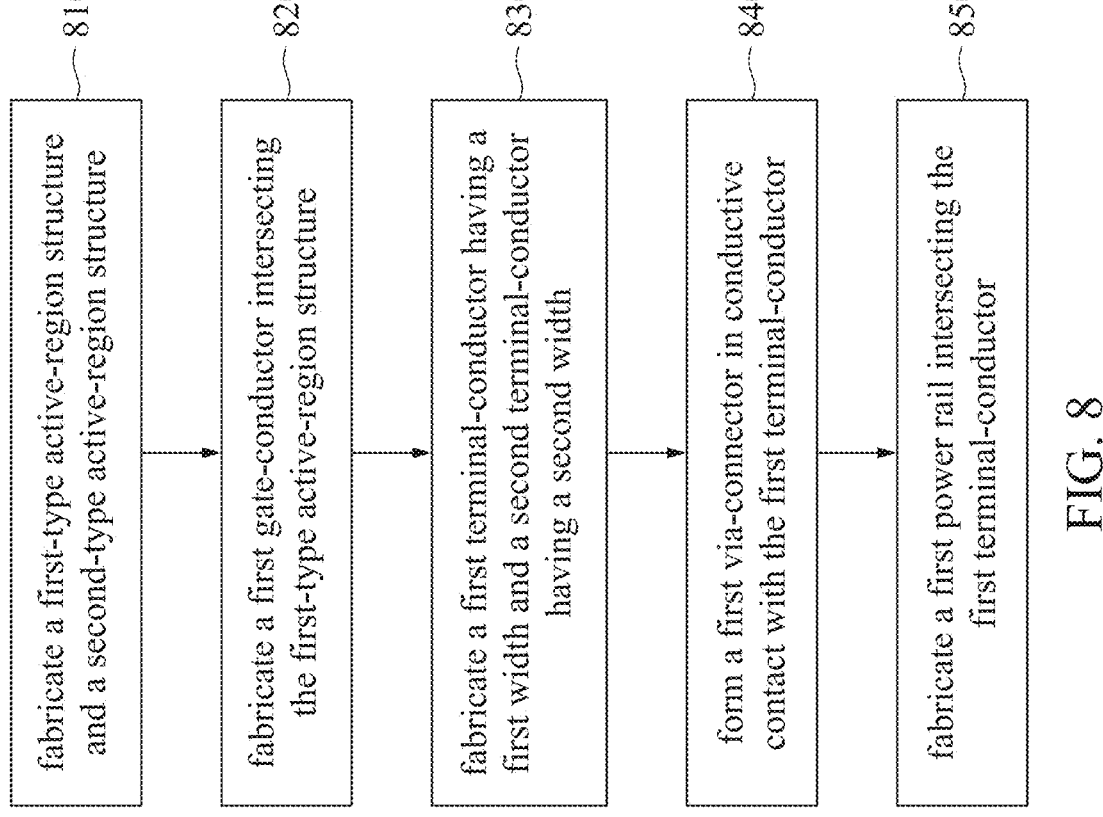

810 — fabricate a first-type active-region structure and a second-type active-region structure 820 — fabricate a first gate-conductor intersecting the first-type active-region structure 830 — fabricate a first terminal-conductor having a first width and a second terminal-conductor having a second width 840 — form a first via-connector in conductive contact with the first terminal-conductor 850 — fabricate a first power rail intersecting the first terminal-conductor

INTEGRATED CIRCUIT HAVING TRANSISTORS WITH DIFFERENT WIDTH SOURCE AND DRAIN TERMINALS

PRIORITY CLAIM

The present application claims the priority of China Application No. 202211101953.8, filed Sep. 9, 2022, which is incorporated by reference herein its entirety

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5B-5C are cross-sectional views of the inverter gate in cutting planes as specified by FIG. 5A, in accordance with some embodiments.

FIG. 6 is a layout diagram of a NAND gate in a circuit cell, in accordance with some embodiments.

FIG. 8 is a flowchart of a method 800 of manufacturing an integrated circuit, in accordance with some embodiments.

DETAILED DESCRIPTION

Figure 1:
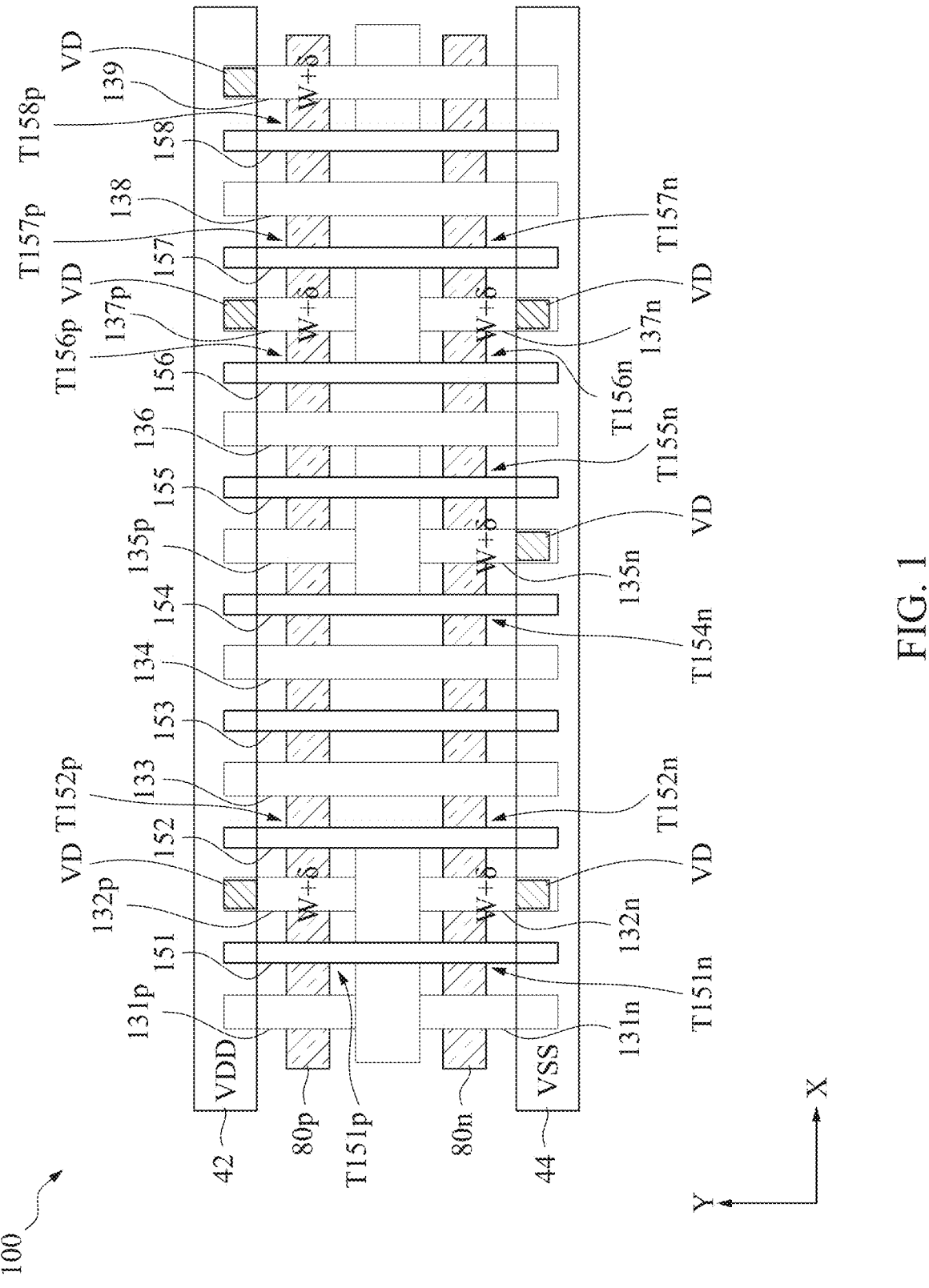
FIG. 1 is a layout diagram of an integrated circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a circuit cell in the integrated circuit includes a transistor that has the channel region and the source/drain regions formed in an active-region structure. Examples of the active-region structure include a fin structure, a nano-sheet structure, or a nano-wire structure. In the circuit cell, a gate-conductor intersects the active-region structure at the channel region, a first terminal-conductor intersects the active-region structure at the source region, and a second terminal-conductor intersects the active-region structure at the drain region. In some embodiments, when the width of the first terminal-conductor is larger than the width of the second terminal-conductor, the speed performance of the circuit cell is improved, as compared with alternative implementations in which the widths of the first terminal-conductor and the second terminal-conductor are the same.

FIG. 1 is a layout diagram of an integrated circuit 100, in accordance with some embodiments. The layout diagram of FIG. 1 includes layout patterns extending in the Y-direction for specifying gate-conductors 151-158, and terminal-conductors (131p-132p, 131n-132n, 133-134, 135p, 135n, 136, 137p, 137n, and 138-139). The layout diagram of FIG. 1 also includes layout patterns extending in the X-direction for specifying active-region structures (80p and 80n), and power rails (42 and 44). The Y-direction is perpendicular to the X-direction.

In the integrated circuit 100 as specified by the layout diagram of FIG. 1, gate-conductors 151-158 intersect the active-region structure 80p at the channel region of various PMOS transistors and intersect the active-region structure 80n at the channel region of various NMOS transistors. In some embodiments, when the active-region structures 80p and 80n are formed with fin structures, the PMOS transistors formed in the active-region structures 80p and the NMOS transistors formed in the active-region structures 80n are FinFETs. In some embodiments, when the active-region structures 80p and 80n are formed with nano-sheet structures, the PMOS transistors formed in the active-region structures 80p and the NMOS transistors formed in the active-region structures 80n are nano-sheet transistors. In some embodiments, when the active-region structures 80p and 80n are formed with nano-wire structures, the PMOS transistors formed in the active-region structures 80p and the NMOS transistors formed in the active-region structures 80n are nano-wire transistors.

In the integrated circuit 100 as specified by the layout diagram of FIG. 1, some of the terminal-conductors intersect the active-region structure 80p at the source/drain regions of PMOS transistors and form the source/drain terminals for the corresponding PMOS transistors, while some of the terminal-conductors intersect the active-region structure 80n at the source/drain regions of NMOS transistors and form the source/drain terminals for the corresponding NMOS transistors. The terminal-conductors intersecting the active-region structure 80p include the terminal-conductors 131p-132p, 133-134, 135p, 136, 137p, and 138-139. The terminal-conductors intersecting the active-region structure 80n include the terminal-conductors 131n-132n, 133-134, 135n, 136, 137n, and 138-139.

In FIG. 1, some of the terminal-conductors have a first width W along the X-direction, while some of the terminal-conductors have a second width W+δ along the X-direction. The second width W+δ is larger than the first width W by a predetermined amount 6. The terminal-conductors having the first width W include 131p, 131n, 133-134, 135p, 136, and 138. The terminal-conductors having the second width W+δ include 132p, 132n, 135n, 137p, 137n, and 139. Each of the terminal-conductors 132p, 135p, 137p, and 139 intersects the power rail 42 and is connected to the power rail 42 through a corresponding via-connector VD. Each of the terminal-conductors 132n, 135n, and 137n intersects the power rail 44 and is connected to the power rail 44 through a corresponding via-connector VD. The power rail 42 is configured to provide an upper supply voltage VDD, while the power rail 44 is configured to provide a lower supply voltage VSS.

In FIG. 1, each of the terminal-conductors 132p, 137p, and 139 is a source terminal of at least one PMOS transistor. The terminal-conductor 132p is the source terminal of a PMOS transistor T151p and the source terminal of a PMOS transistor T152p. The PMOS transistor T151p has the channel region in the active-region structure 80p under the gate-conductor 151 and the PMOS transistor T152p has the channel region in the active-region structure 80p under the gate-conductor 152. The terminal-conductor 137p is the source terminal of a PMOS transistor T156p and the source terminal of a PMOS transistor T157p. The PMOS transistor T156p has the channel region in the active-region structure 80p under the gate-conductor 156 and the PMOS transistor T157p has the channel region in the active-region structure 80p under the gate-conductor 157. The terminal-conductor 139 is the source terminal of a PMOS transistor T158p having the channel region in the active-region structure 80p under the gate-conductor 158.

As compared with an alternative implementation in which each of the terminal-conductors 132p, 137p, and 139 has the first width W, increasing the width of each of the terminal-conductors 132p, 137p, and 139 to the second width W+δ reduces signal delays in the integrated circuit 100. When the width of a terminal-conductor (e.g., 132p, 137p, or 139) is increased, the resistance between the source terminal of a corresponding transistor (e.g., T151p, T152p, T156p, T157p, or T158p) and the power rail 42 is reduced, and the capacitance between the source terminal of a corresponding transistor (e.g., T151p, T152p, T156p, T157p, or T158p) and the signal ground is increased. Each of the power rails or conductors that is maintained at a constant voltage is a node of the signal ground.

In FIG. 1, each of the terminal-conductors 132n, 135n, and 137n, is a source terminal of at least one NMOS transistor. The terminal-conductor 132n is the source terminal of the NMOS transistor T151n and the source terminal of the NMOS transistor T152n. The NMOS transistor T151n has the channel region in the active-region structure 80n under the gate-conductor 151 and the NMOS transistor T152n has the channel region in the active-region structure 80n under the gate-conductor 152. The terminal-conductor 135n is the source terminal of the NMOS transistor T154n and the source terminal of the NMOS transistor T155n. The NMOS transistor T154n has the channel region in the active-region structure 80n under the gate-conductor 154 and the NMOS transistor T155n has the channel region in the active-region structure 80n under the gate-conductor 155. The terminal-conductor 137n is the source terminal of the NMOS transistor T156n and the source terminal of the NMOS transistor T157n. The NMOS transistor T156n has the channel region in the active-region structure 80n under the gate-conductor 156 and the NMOS transistor T157n has the channel region in the active-region structure 80n under the gate-conductor 157.

As compared with an alternative implementation in which each of the terminal-conductors 132n, 135n, and 137n has the first width W, increasing the width of each of the terminal-conductors 132n, 135n, and 137n to the second width W+δ reduces signal delays in the integrated circuit 100. When the width of a terminal-conductor (e.g., 132n, 135n, and 137n) is increased, the resistance between the source terminal of a corresponding transistor (e.g., T151n, T152n, T154n, T155n, T156n, or T157n) and the power rail 44 is reduced, and the capacitance between the source terminal of a corresponding transistor (e.g., T151n, T152n, T154n, T155n, T156n, or T157n) and the signal ground is increased.

In some embodiments, the pitch distance between adjacent terminal-conductors intersecting the active-region structure 80p is maintained at the same distance, even though some of the terminal-conductors intersecting the active-region structure 80p have the first width W and some of the terminal-conductors intersecting the active-region structure 80p have the second width W+δ. Similarly, the pitch distance between adjacent terminal-conductors intersecting the active-region structure 80n is maintained at the same distance, even though some of the terminal-conductors intersecting the active-region structure 80n have the first width W and some of the terminal-conductors intersecting the active-region structure 80n have the second width W+δ.

Figure 2:
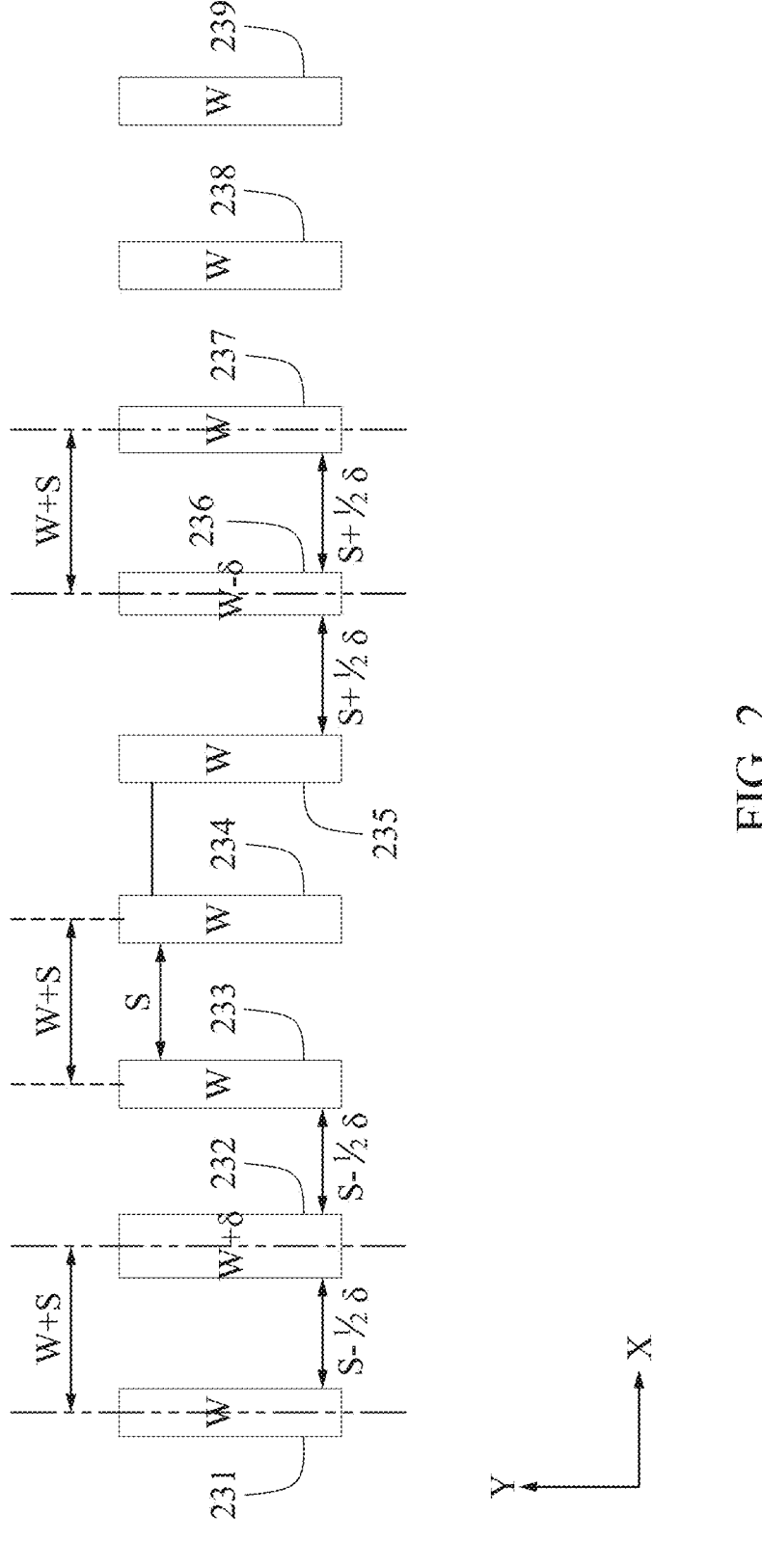
FIG. 2 is a layout diagram of an array of terminal-conductors having the same pitch distance between adjacent terminal-conductors, in accordance with some embodiments.

FIG. 2 is a layout diagram of an array 200 of terminal-conductors having the same pitch distance between adjacent terminal-conductors, in accordance with some embodiments. The array 200 of terminal-conductors includes terminal-conductors 231-239. Each of the terminal-conductors 231, 233-235, and 237-239 has the first width W, the terminal-conductor 232 has the second width W+δ, and the terminal-conductor 236 has the third width W−δ. The pitch distance between any pair of adjacent terminal-conductors in FIG. 2 is the same distance W+S. For example, while each of the terminal-conductors 233 and 234 has the first width W, the pitch distance between the terminal-conductors 233 and 234 is the distance W+S, because the edges of the terminal-conductors 233 and 234 are separated by the distance S. While the terminal-conductors 231 and 232 correspondingly have the first width W and the second width W+δ, the pitch distance between the terminal-conductors 231 and 232 is the distance W+S, because the edges of the terminal-conductors 231 and 232 are separated by the distance S−δ/2. While the terminal-conductors 236 and 237 correspondingly have the third width W−δ and the first width W, the pitch distance between the terminal-conductors 236 and 237 is the distance W+S, because the edges of the terminal-conductors 236 and 237 are separated by the distance S+δ/2.

In some embodiments, the second width W+δ is larger than the first width W by at least 20%. In some embodiments, the second width W+δ is larger than the first width W by at least 10%. In some embodiments, the first width W is larger than the third width W−δ by at least 20%. In some embodiments, the first width W is larger than the third width W−δ by at least 10%. In some embodiments, the second width W+δ is increased to a value without reducing the fabrication yield of the integrated circuit. When the second width W+δ is increased, the edge separation between a given terminal-conductor having the second width and one of the adjacent gate-conductor is decreased, which may increase the probability of unintentional shorting between the given terminal-conductor and the adjacent gate and consequently reduces the fabrication yield. In some embodiments, the third width W−δ is decreased to a value without reducing the fabrication yield of the integrated circuit. As the third width W−δ is decreased further, a given terminal-conductor may become too narrow, and the probability of forming an unintentional broken wire in the given terminal-conductor may increase, which consequently reduces the fabrication yield.

In some embodiments, the widths of some terminal-conductors in an integrated circuit are individually adjusted, whereby the performance of the integrated circuit is improved. In some embodiments, the width of at least one terminal-conductor is increased from the default width W, the width of at least one terminal-conductor is decreased from the default width W, and the widths of some terminal-conductors are maintained at the default width W.

Figure 3:
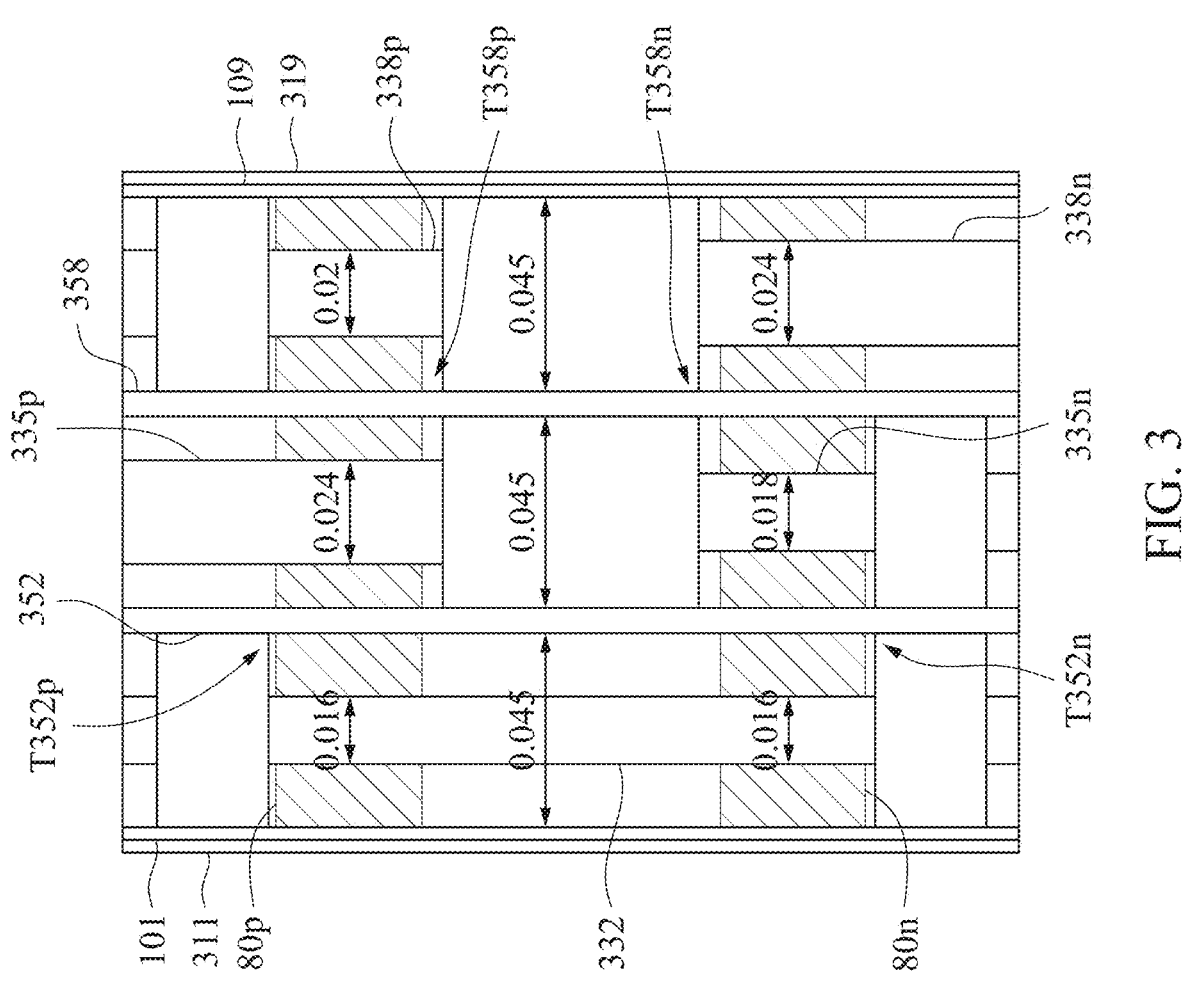
FIG. 3 is a layout diagram of a circuit cell in an integrated circuit, in accordance with some embodiments.

FIG. 3 is a layout diagram of a circuit cell 300 in an integrated circuit, in accordance with some embodiments. The layout diagram of FIG. 3 includes the layout patterns extending in the Y-direction for specifying gate-conductors (352 and 358), dummy gate-conductors (311 and 319) and terminal-conductors (332, 335*p*, 335*n*, 338*p*, and 338*n*). The layout diagram of FIG. 3 also includes the layout patterns extending in the X-direction for specifying active-region structures (80*p* and 80*n*) and power rails (42 and 44).

In the integrated circuit as specified by the layout diagram of FIG. 3, the gate-conductor 352 intersects the active-region structure 80*p* at the channel region of a PMOS transistors T352*p* and intersects the active-region structure 80*n* at the channel region of an NMOS transistors T352*n*. The gate-conductor 358 intersects the active-region structure 80*p* at the channel region of a PMOS transistors T358*p* and intersects the active-region structure 80*n* at the channel region of an NMOS transistors T358*n*. The dummy gate-conductors 311 and 319 at the vertical boundaries 101 and 109 of the circuit cell are not implemented as gate terminals of PMOS or NMOS transistors.

The terminal-conductor 332 intersects the active-region structure 80*p* at the drain region of the PMOS transistors T352*p* and intersects the active-region structure 80*n* at the drain region of an NMOS transistors T352*n*. The terminal-conductor 335*p* intersects the active-region structure 80*p* at the source regions of the PMOS transistors T352*p* and T358*p*. The terminal-conductor 338*p* intersects the active-region structure 80*p* at the drain regions of the PMOS transistor T358*p*. The terminal-conductor 335*n* intersects the active-region structure 80*n* at the source region of the NMOS transistors T352*n* and the drain region of the NMOS transistors T358*n*. The terminal-conductor 338*n* intersects the active-region structure 80*n* at the source region of the NMOS transistor T358*n*.

In FIG. 3, the numerical values of the widths of the terminal-conductors and the numerical values of the separations between the gate-conductors are labeled. Because of the layout design of FIG. 3 is provided as an example and the dimensions in the layout design are proportionally scalable, the numerical values for the widths and the separations are provided in an arbitrary unit (a.u.). For example, the separation between gate-conductors 352 and 358 is labeled 0.045 in a.u. When the arbitrary unit (a.u.) is selected to be 1000 nanometer, the separation between gate-conductors 352 and 358 is 45 nanometer. When the arbitrary unit (a.u.) is selected to be 2000 nanometer, the separation between gate-conductors 352 and 358 is 90 nanometer. When the arbitrary unit (a.u.) is selected to be 500 nanometer, the separation between gate-conductors 352 and 358 is 22.5 nanometer.

In FIG. 3, the terminal-conductor 335*p* functions as the source terminal of the PMOS transistors T352*p* and T358*p*, and the terminal-conductor 338*n* functions as the source terminal of the NMOS transistor T358*n*. The width of each of the terminal-conductors 335*p* and 338*n* is implemented as 0.024 a.u., which is larger than the width of any other terminal-conductor in the circuit cell of FIG. 3. Specifically, the width of the terminal-conductor 332 is 0.016 a.u., the width of the terminal-conductor 338*p* is 0.020 a.u., and the width of the terminal-conductor 335*n* is 0.018 a.u. In some embodiments, when the widths of the terminal-conductors that function as source terminals are increased and the widths of the terminal-conductors that function as drain terminals are decreased, the speed performance of the cell circuit is improved. In some embodiments, however, the width of the terminal-conductor 335*p* or 338*n* is increased to a value without reducing the fabrication yield of the integrated circuit having one or more circuit cells 300. When the width of the terminal-conductor 335*p* or 338*n* is increased, the edge separation between an adjacent gate-conductor (e.g., the gate-conductor 352 or 358) and the terminal-conductor 335*p* or 338*n* is decreased, which may increase the probability of unintentional shorting between the gate-conductor and the terminal-conductor 335*p* or 338*n* and consequently influence the fabrication yield. Similarly, in some embodiments, the width of the terminal-conductor 332 is decreased to a value without reducing the fabrication yield of the integrated circuit having one or more circuit cells 300. When the width of the terminal-conductor 332 is decreased and becomes too narrow, the probability of having an unintentional broken wire in the terminal-conductor 332 may increase and consequently influence the fabrication yield.

Figure 4A:
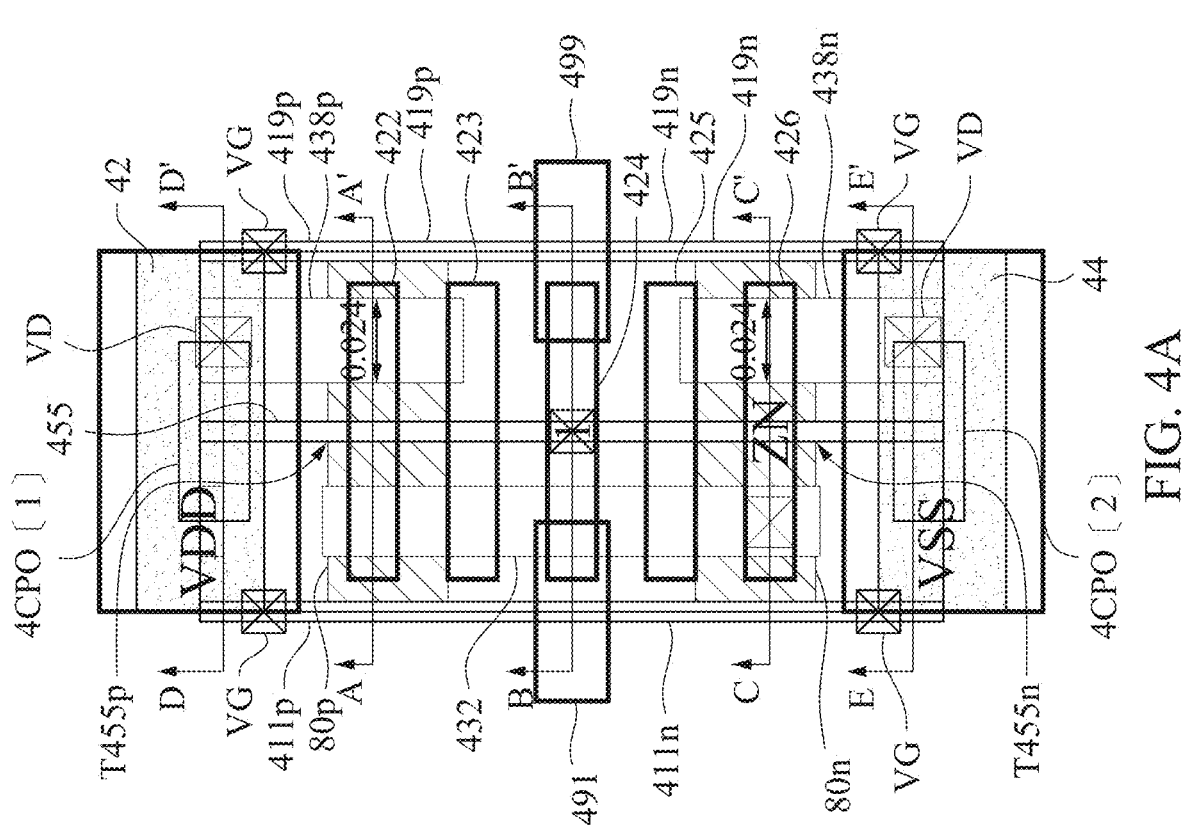
FIG. 4A is a layout diagram of an inverter gate in a circuit cell, in accordance with some embodiments.

FIG. 4A is a layout diagram of an inverter gate 400 in a circuit cell, in accordance with some embodiments. The layout diagram of FIG. 4A includes the layout patterns extending in the Y-direction for specifying gate-conductor 455, dummy gate-conductors (411*p*, 411*n*, 419*p*, and 419*n*) and terminal-conductors (432, 438*p*, and 438*n*). The layout diagram of FIG. 4A also includes the layout patterns extending in the X-direction for specifying active-region structures (80*p* and 80*n*), horizontal conducting lines (422, 424, and 426) in a first metal layer, and power rails (42 and 44).

In the inverter gate 400 as specified by the layout diagram of FIG. 4A, the gate-conductor 455 intersects the active-region structure 80p at the channel region of a PMOS transistor T455p and intersects the active-region structure 80n at the channel region of an NMOS transistor T455n. The dummy gate-conductors 411p and 411n at a first vertical boundary of the circuit cell for the inverter gate 400 are separated from each other as specified by the cut gate layout pattern 491. The dummy gate-conductors 419p and 419n at a second vertical boundary of the circuit cell for the inverter gate 400 are separated from each other as specified by the cut gate layout pattern 499. Each of the dummy gate-conductors 411p and 419p is connected to the power rail 42 through a corresponding via-connector VG. Each of the dummy gate-conductors 411n and 419n is connected to the power rail 44 through a corresponding via-connector VG.

The terminal-conductor 432 intersects the active-region structure 80p at the drain region of the PMOS transistors T455p and intersects the active-region structure 80n at the drain region of an NMOS transistors T455n. The terminal-conductor 438p intersects the active-region structure 80p at the source region of the PMOS transistor T455p and connects to the power rail 42. In some embodiments, the terminal-conductor 438p is connected to the power rail 42 through a via-connector. The terminal-conductor 438n intersects the active-region structure 80n at the source region of the NMOS transistor T455n and connects to the power rail 44. In some embodiments, the terminal-conductor 438n is connected to the power rail 44 through a via-connector.

The horizontal conducting line 424 is connected to the gate-conductor 455 through a via-connector VG and functions as a pin connector for the input signal of the inverter gate 400. The horizontal conducting line 426 is connected to the terminal-conductor 432 through a via-connector VD and functions as a pin connector for the output signal "ZN" of the inverter gate 400.

Figure 4B:
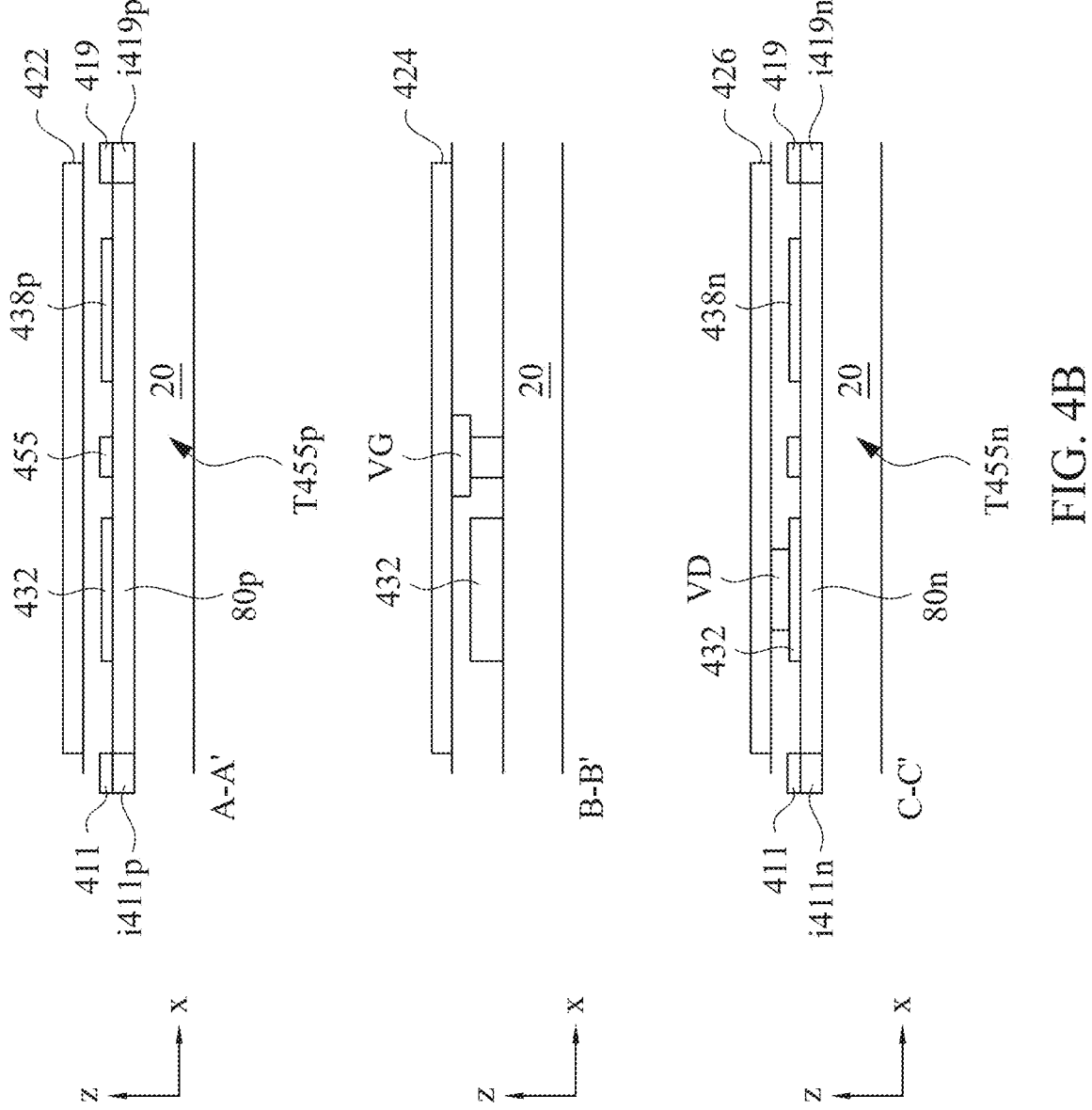
FIGS. 4B-4C are cross-sectional views of the inverter gate in cutting planes as specified by FIG. 4A, in accordance with some embodiments.

FIG. 4B is cross-sectional views of the inverter gate 400 in cutting planes A-A', B-B', and C-C' as specified by FIG. 4A, in accordance with some embodiments. In the cross-sectional view of the cutting plane A-A' as shown in FIG. 4B, the active-region structure 80p is on the substrate 20. The gate-conductor 455 intersects the active-region structure 80p at the channel region of the PMOS transistor T455p. The terminal-conductors 432 and 418p intersect the active-region structure 80p correspondingly at the drain region and the source region of the PMOS transistors T455p. In some embodiments, the active regions (such as, the source region, the channel region, or the drain region) in the active-region structure 80p are isolated from the active regions in the adjacent cells by the boundary isolation region i411p under the dummy gate-conductor 411 and the boundary isolation region i419p under the dummy gate-conductor 419. The horizontal conducting line 422 is in the first metal layer overlying the interlayer dielectric that covers the gate-conductor 455 and the terminal-conductors 432 and 418p.

In the cross-sectional view of the cutting plane B-B' as shown in FIG. 4B, the gate-conductor 455 and the terminal-conductors 432 are supported by the substrate 20. The horizontal conducting line 424 is in the first metal layer overlying the interlayer dielectric that covers the gate-conductor 455 and the terminal-conductor 432. The horizontal conducting line 424 is connected to the gate-conductor 455 through the via-connector VG.

In the cross-sectional view of the cutting plane C-C' as shown in FIG. 4B, the active-region structure 80n is on the substrate 20. The gate-conductor 455 intersects the active-region structure 80n at the channel region of the NMOS transistor T455n. The terminal-conductors 432 and 438n intersect the active-region structure 80n correspondingly at the drain region and the source region of the NMOS transistors T455n. In some embodiments, the active regions (such as, the source region, the channel region, or the drain region) in the active-region structure 80n are isolated from the active regions in the adjacent cells by the boundary isolation region i411n under the dummy gate-conductor 411 and the boundary isolation region i419n under the dummy gate-conductor 419. The horizontal conducting line 426 is in the first metal layer overlying the interlayer dielectric that covers the gate-conductor 455 and the terminal-conductors 432 and 438n. The horizontal conducting line 426 is connected to the terminal-conductor 432 through the via-connector VD.

Figure 4C:
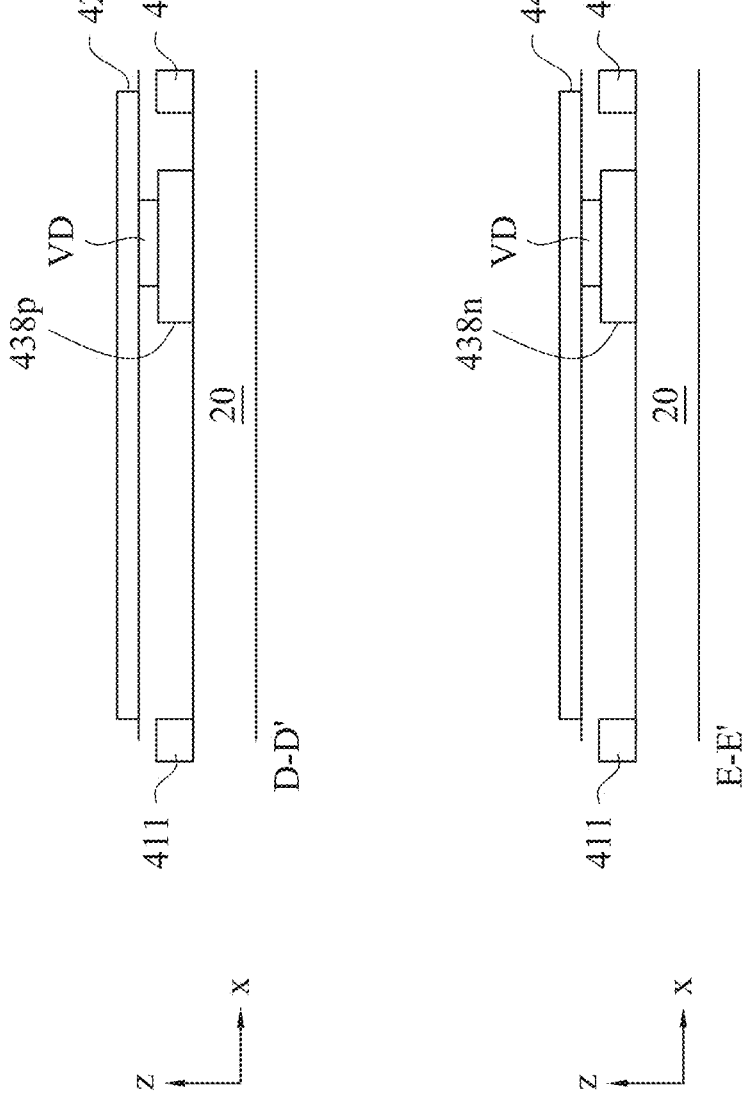

FIG. 4C is cross-sectional views of the inverter gate 400 in cutting planes D-D' and E-E' as specified by FIG. 4A, in accordance with some embodiments. As shown in the cross-sectional view of the cutting plane D-D', the power rail 42 is conductively connected to the terminal-conductor 438p through a corresponding via-connector VD. As shown in the cross-sectional view of the cutting plane E-E', the power rail 44 is also conductively connected to the terminal-conductor 438n through a corresponding via-connector VD.

In FIG. 4C, the gate-conductor 455 and the terminal-conductor 432 are absence in the cutting plane D-D' and the cutting plane E-E', based on the layout designs in FIG. 4A. In the layout diagram of FIG. 4A, the gate-conductor 455 extending in the positive Y-direction is terminated before reaching the cutting plane D-D', as specified by the cut-gate pattern 4CPO[1], while the terminal-conductor 432 extending in the positive Y-direction does not reach the cutting plane D-D'. Additionally, the gate-conductor 455 extending in the negative Y-direction is terminated before reaching the cutting plane E-E', as specified by the cut-gate pattern 4CPO[2], while the terminal-conductor 432 extending in the negative Y-direction does not reach the cutting plane E-E'.

In FIGS. 4A-4C, because the terminal-conductors 438p and 438n are source terminals of transistors, the widths of the terminal-conductors 438p and 438n are implemented to be larger than the width of the terminal-conductor 432, whereby the speed performance of the inverter gate 400 is improved. In one example, the width of each of the terminal-conductors 438p and 438n is 0.024 micrometer, and the width of the terminal-conductor 432 is smaller than 0.024 micrometer by a predetermined amount (e.g., by 0.008 micrometer).

Figure 5A:
FIG. 5A is a layout diagram of an inverter gate in a circuit cell, in accordance with some embodiments.

FIG. 5A is a layout diagram of an inverter gate 500 in a circuit cell, in accordance with some embodiments. The layout diagram of FIG. 5A includes the layout patterns extending in the Y-direction for specifying gate-conductors (552, 554, 556, and 558), dummy gate-conductors (511p, 511n, 519p, and 519n), and terminal-conductors (532p, 535p, 538p, 532n, 535n, 538n, 534, and 536). The layout diagram of FIG. 5A also includes the layout patterns extending in the X-direction for specifying active-region structures (80p and 80n), horizontal conducting lines (522-526) in a first metal layer, and power rails (42 and 44).

In the inverter gate 500 as specified by the layout diagram of FIG. 5A, each of the gate-conductors 552, 554, 556, and 558 intersects the active-region structure 80p correspondingly at the channel region of one of the PMOS transistors T552p, T554p, T556p, and T558p. Each of the gate-conductors 552, 554, 556, and 558 also intersects the active-region structure 80n correspondingly at the channel region of one of the NMOS transistors T552n, T554n, T556n, and T558n. The dummy gate-conductors 511p and 511n at a first vertical boundary of the circuit cell for the inverter gate 500 are separated from each other as specified by a cut gate layout pattern 591. The dummy gate-conductors 519p and 519n at a second vertical boundary of the circuit cell for the inverter gate 500 are separated from each other as specified by a cut gate layout pattern 599. Each of the dummy gate-conductors 511p and 519p is connected to the power rail 42 through a corresponding via-connector VG. Each of the dummy gate-conductors 511n and 519n is connected to the power rail 44 through a corresponding via-connector VG.

Each of terminal-conductors 532p, 535p, and 538p intersects the active-region structure 80p correspondingly at the source region of at least one of the PMOS transistors T552p, T554p, T556p, and T558p. Each of terminal-conductors 532p, 535p, and 538p is also connected to the power rail 42. Each of terminal-conductors 532n, 535n, and 538n intersects the active-region structure 80n correspondingly at the source region of at least one of the NMOS transistors T552n, T554n, T556n, and T558n. Each of terminal-conductors 532n, 535n, and 538n is also connected to the power rail 44. The terminal-conductor 534 intersects the active-region structure 80p at the drain regions of the PMOS transistors T552p and T554p and intersects the active-region structure 80n at the drain regions of the NMOS transistors T552n and T554n. The terminal-conductor 536 intersects the active-region structure 80p at the drain regions of the PMOS transistors T556p and T558p and intersects the active-region structure 80n at the drain regions of the NMOS transistors T556n and T558n.

The horizontal conducting line 524 is connected to each of the gate-conductors 552, 554, 556, and 558 through a corresponding via-connector VG and functions as a pin connector for the input signal of the inverter gate 500. The horizontal conducting line 526 is connected to each of the terminal-conductors 534 and 536 through a corresponding via-connector VD and functions as a pin connector for the output signal "ZN" of the inverter gate 500. The inverter gate 500 includes four PMOS transistors T552p, T554p, T556p, and T558p and four NMOS transistors T552n, T554n, T556n, and T558n. The gate terminals of the four PMOS transistors and the four NMOS transistors are all connected together as the input node for the inverter gate 500. The drain terminals of the four PMOS transistors and the four NMOS transistors are all connected together as the output node for the inverter gate 500.

Figure 5B:
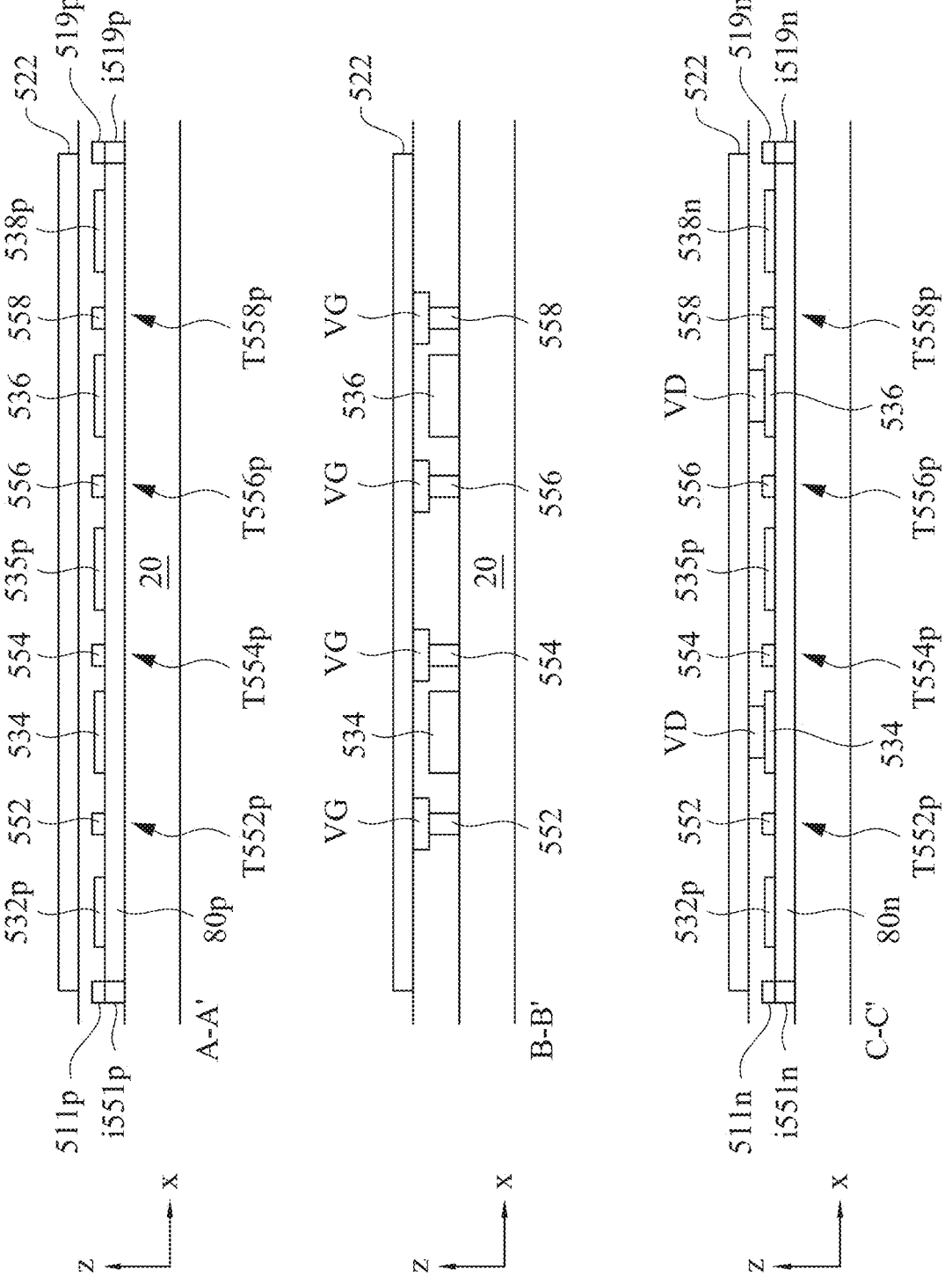

FIG. 5B is cross-sectional views of the inverter gate 500 in cutting planes A-A', B-B', and C-C' as specified by FIG. 5A, in accordance with some embodiments. In the cross-sectional view of the cutting plane A-A' as shown in FIG. 5B, the active-region structure 80p is on the substrate 20. Each of the gate-conductors 552, 554, 556, and 558 intersects the active-region structure 80p at a channel region of one of the PMOS transistors T552p, T554p, T556p, and T558p. Each of terminal-conductors 532p, 534, 535p, 534, and 538p intersects the active-region structure 80p at a source/drain region of at least one of the PMOS transistors T552p, T554p, T556p, and T558p. In some embodiments, the active regions of the inverter gate 500 in the active-region structure 80p are isolated from the active regions in the adjacent cells by the boundary isolation region i511p under the dummy gate-conductor 511 and the boundary isolation region i519p under the dummy gate-conductor 519. The horizontal conducting line 522 is in the first metal layer overlying the interlayer dielectric that covers the gate-conductors and the terminal-conductors.

In the cross-sectional view of the cutting plane B-B' as shown in FIG. 5B, the gate-conductors 552, 554, 556, and 558 and the terminal-conductors 534 and 536 are supported by the substrate 20. The horizontal conducting line 524 is in the first metal layer overlying the interlayer dielectric that covers the gate-conductors 552, 554, 556, and 558 and the terminal-conductors 534 and 536. The horizontal conducting line 524 is connected to each of gate-conductors 552, 554, 556, and 558 through a via-connector VG.

In the cross-sectional view of the cutting plane C-C' as shown in FIG. 5B, the active-region structure 80n is on the substrate 20. Each of the gate-conductors 552, 554, 556, and 558 intersects the active-region structure 80n at a channel region of one of the NMOS transistors T552n, T554n, T556n, and T558n. Each of terminal-conductors 532n, 534, 535n, 534, and 538n intersects the active-region structure 80n at a source/drain region of at least one of the NMOS transistors T552n, T554n, T556n, and T558n. In some embodiments, the active regions of the inverter gate 500 in the active-region structure 80n are isolated from the active regions in the adjacent cells by the boundary isolation region i511n under the dummy gate-conductor 511 and the boundary isolation region i519n under the dummy gate-conductor 519. The horizontal conducting line 526 is in the first metal layer overlying the interlayer dielectric that covers the gate-conductors and the terminal-conductors. The horizontal conducting line 526 is connected to each of the terminal-conductors 534 and 534 through a via-connector VD.

FIG. 5C is cross-sectional views of the inverter gate 500 in cutting planes D-D' and E-E' as specified by FIG. 5A, in accordance with some embodiments. As shown in the cross-sectional view of the cutting plane D-D', the power rail 42 is conductively connected to each of the terminal-conductors 532p, 535p, and 538p through a corresponding via-connector VD. As shown in the cross-sectional view of the cutting plane E-E', the power rail 44 is conductively connected to each of the terminal-conductors 532n, 535n, and 538n through a corresponding via-connector VD.

In FIG. 5C, the gate-conductors 552, 554, 556, and 558 and the terminal-conductors 534 and 536 are absence in the cutting plane D-D' and the cutting plane E-E', based on the layout designs in FIG. 5A. In the layout diagram of FIG. 5A, the gate-conductors 552, 554, 556 extending in the Y-direction is terminated before reaching the cutting plane D-D' or the cutting plane E-E', as specified by the cut-gate pattern 5CPO[1] and the cut-gate pattern 5CPO[2], while none of the terminal-conductors 534 and 536 extending in the Y-direction reaches the cutting plane D-D' or the cutting plane E-E'.

In FIGS. 5A-5C, because the terminal-conductors 532p, 535p, and 538p are source terminals of the PMOS transistors and the terminal-conductors 532n, 535n, and 538n are source terminals of the NMOS transistors, the widths of the terminal-conductors 532p, 535p, and 538p and the widths of the terminal-conductors 532n, 535n, and 538n are implemented to be larger than the widths of the terminal-conductors 534 and 536, whereby the speed performance of the inverter gate 500 is improved.

FIG. 6 is a layout diagram of a NAND gate 600 in a circuit cell, in accordance with some embodiments. The layout diagram of FIG. 6 includes the layout patterns extending in the Y-direction for specifying gate-conductors (652 and 658), dummy gate-conductors (611p, 611n, 619p, and 619n), and terminal-conductors (632, 635p, 635n, 638p, and 638n). The layout diagram of FIG. 6 also includes the layout patterns extending in the X-direction for specifying active-region structures (80*p* and 80*n*), horizontal conducting lines (622-626) in a first metal layer, and power rails (42 and 44).

In the integrated circuit as specified by the layout diagram of FIG. 6, the gate-conductor 652 intersects the active-region structure 80*p* at the channel region of a PMOS transistors T652*p* and intersects the active-region structure 80*n* at the channel region of an NMOS transistors T652*n*. The gate-conductor 658 intersects the active-region structure 80*p* at the channel region of a PMOS transistors T658*p* and intersects the active-region structure 80*n* at the channel region of an NMOS transistors T658*n*. The dummy gate-conductors 611*p* and 611*n* at a first vertical boundary of the circuit cell for NAND gate 600 are separated from each other as specified by the cut gate layout pattern 691. The dummy gate-conductors 619*p* and 619*n* at a second vertical boundary of the circuit cell for the NAND gate 600 are separated from each other as specified by the cut gate layout pattern 699. Each of the dummy gate-conductors 611*p* and 619*p* is connected to the power rail 42 through a corresponding via-connector VG. Each of the dummy gate-conductors 611*n* and 619*n* is connected to the power rail 44 through a corresponding via-connector VG.

The terminal-conductor 632 intersects the active-region structure 80*p* at the drain region of the PMOS transistors T652*p* and intersects the active-region structure 80*n* at the drain region of an NMOS transistors T652*n*. The terminal-conductor 635*p* intersects the active-region structure 80*p* at the source regions of the PMOS transistors T652*p* and T658*p* and is connected to the power rail 42. In some embodiments, the terminal-conductor 635*p* is connected to the power rail 42 through a via-connector. The terminal-conductor 638*p* intersects the active-region structure 80*p* at the drain regions of the PMOS transistor T658*p*. The terminal-conductor 635*n* intersects the active-region structure 80*n* at the source region of the NMOS transistors T652*n* and the drain region of the NMOS transistors T658*n*. The terminal-conductor 638*n* intersects the active-region structure 80*n* at the source region of the NMOS transistor T658*n* is connected to the power rail 44. In some embodiments, the terminal-conductor 638*n* is connected to and the power rail 44 through a via-connector.

The horizontal conducting line 625 is connected to the gate-conductors 652 through a corresponding via-connector VG and functions as a pin connector for the input signal A1 of the NAND gate 600. The horizontal conducting line 624 is connected to the gate-conductors 658 through a corresponding via-connector VG and functions as a pin connector for the input signal A2 of the NAND gate 600. The horizontal conducting line 622 is connected to each of the terminal-conductors 632 and 638 through a corresponding via-connector VD and functions as a pin connector for the output signal ZN of NAND gate 600.

The NAND gate 600 includes two PMOS transistors T652*p* and T658*p* having source/drain terminals connected parallelly between the power rail 42 and the horizontal conducting line 622. The NAND gate 600 includes two NMOS transistors T652*n* and T658*n* having source/drain terminals connected in series between the horizontal conducting line 622 and the power rail 44.

In FIG. 6, because the terminal-conductor 635*p* is the source terminal of the PMOS transistors T652*p* and T658*p* and the terminal-conductor 638*n* is the source terminal of the NMOS transistor T658*n*, the widths of the terminal-conductors 635*p* and 638*n* are implemented to be larger than the widths of the terminal-conductors 632, 635*n*, and 638*p*, whereby the speed performance of the NAND gate 600 is improved.

Figure 7:
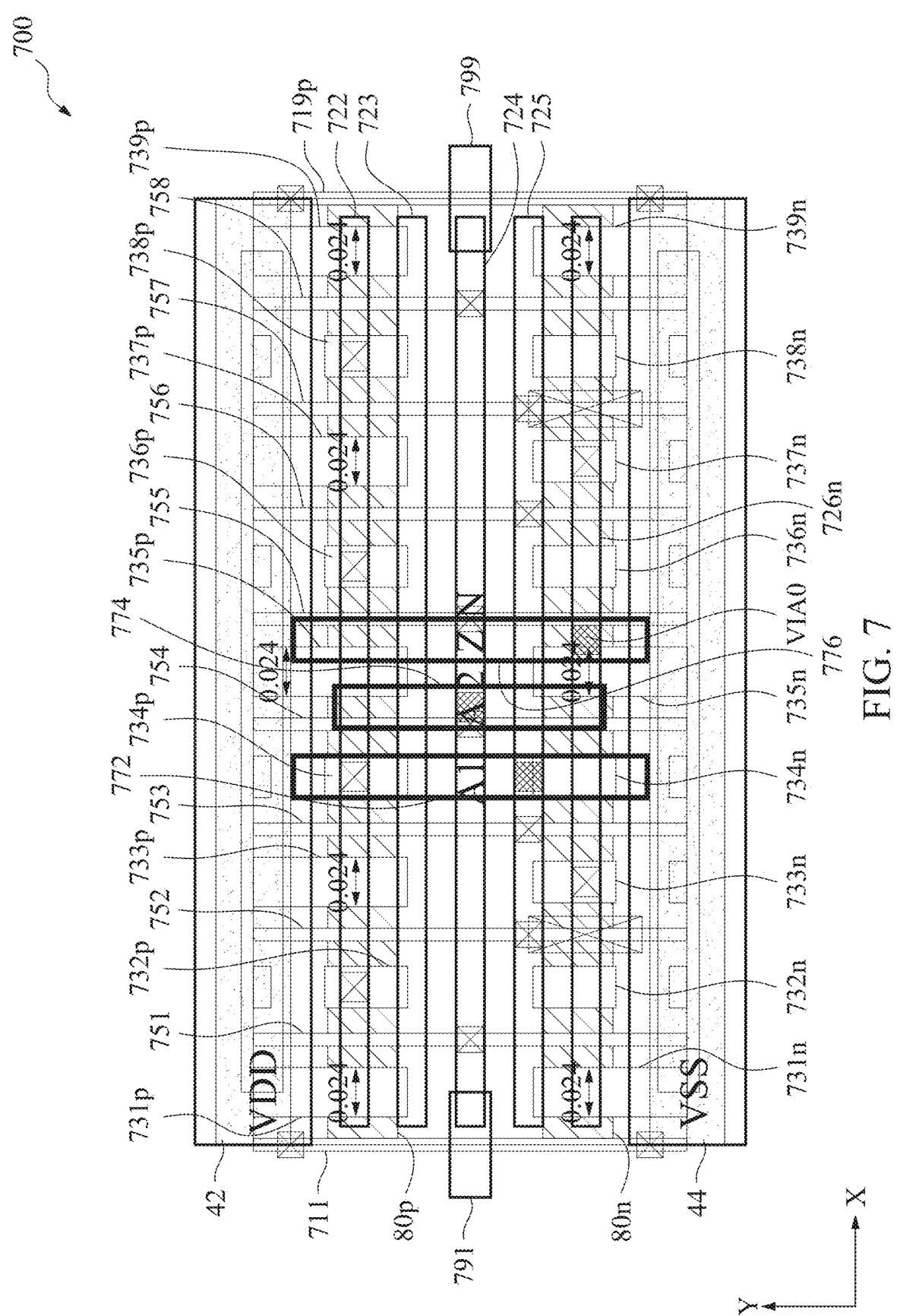
FIG. 7 is a layout diagram of a NAND gate in a circuit cell, in accordance with some embodiments.

FIG. 7 is a layout diagram of a NAND gate 700 in a circuit cell, in accordance with some embodiments. The layout diagram of FIG. 7 includes the layout patterns extending in the Y-direction for specifying gate-conductors (751-758), dummy gate-conductors (711*p*, 711*n*, 719*p*, and 719*n*), and terminal-conductors (731*p*-739*p* and 731*n*-739*n*). The layout diagram of FIG. 7 also includes the layout patterns extending in the X-direction for specifying active-region structures (80*p* and 80*n*), horizontal conducting lines (722-726) in a first metal layer, and power rails (42 and 44). The layout diagram of FIG. 7 also includes the layout patterns extending in the Y-direction for specifying vertical conducting lines (772, 774, and 776) in a second metal layer which is isolated from the first metal layer by one or more layer of interlayer dielectric.

In the NAND gate 700 as specified by the layout diagram of FIG. 7, each of the gate-conductors 751-758 intersects the active-region structure 80*p* correspondingly at the channel region of one of the PMOS transistors T751*p*-T758*p* and intersects the active-region structure 80*n* correspondingly at the channel region of one of the NMOS transistors T751*n*-T758*n*. The dummy gate-conductors 711*p* and 711*n* at a first vertical boundary of the circuit cell for the NAND gate 700 are separated from each other as specified by a cut gate layout pattern 791. The dummy gate-conductors 719*p* and 719*n* at a second vertical boundary of the circuit cell for the NAND gate 700 are separated from each other as specified by a cut gate layout pattern 799. Each of the dummy gate-conductors 711*p* and 719*p* is connected to the power rail 42 through a corresponding via-connector VG. Each of the dummy gate-conductors 711*n* and 719*n* is connected to the power rail 44 through a corresponding via-connector VG.

The terminal-conductors 731*p*, 733*p*, 735*p*, 737*p* and 739*p* intersect the active-region structure 80*p* correspondingly at the source regions of the PMOS transistors T751*p*, T752*p*-T753*p*, T754*p*-T755*p*, T756*p*-T757*p*, and T758*p*. The terminal-conductors 731*p*, 733*p*, 735*p*, 737*p* and 739*p* are also connected to the power rail 42. The terminal-conductors 732*p*, 734*p*, 736*p*, and 738*p* intersect the active-region structure 80*p* correspondingly at the drain regions of the PMOS transistors T751*p*-T752*p*, T753*p*-T754*p*, T755*p*-T756*p*, and T757*p*-T758*p*. Each of the terminal-conductors 732*p*, 734*p*, 736*p*, and 738*p* is also connected to the horizontal conducting line 722 through a corresponding via-connector VD.

The terminal-conductors 731*n*, 735*n*, and 739*n* intersect the active-region structure 80*p* correspondingly at the source regions of the NMOS transistors T751*n*, T754*n*-T755*n*, and T758*n*. The terminal-conductors 731*n*, 735*n*, and 739*n* are also connected to the power rail 44. The terminal-conductors 733*n* and 737*n* intersect the active-region structure 80*p* correspondingly at the drain regions of the NMOS transistors T752*n*-T753*n* and T756*n*-T757*n*. Each of the terminal-conductors 733*n* and 737*n* is also connected to the horizontal conducting line 726 through a corresponding via-connector VD. The terminal-conductors 732*n*, 734*n*, 736*n*, and 738*n* intersect the active-region structure 80*n* correspondingly at the source/drain regions of the NMOS transistors T751*n*-T752*n*, T753*n*-T754*n*, T755*n*-T756*n*, and T757*n*-T758*n*.

In FIG. 7, The eight PMOS transistors T751*p*-T758 are connected parallelly (with the source/drain terminals) between the power rail 42 and the horizontal conducting line 722. The eight NMOS transistors are grouped into four pairs of NMOS transistors. The four pairs of NMOS transistors include the pair of the NMOS transistors T751*n*-T752*n*, the pair of the NMOS transistors T753$n$-T754$n$, the pair of the NMOS transistors T755$n$-T756$n$, and the pair of the NMOS transistors T757$n$-T758$n$. The two NMOS transistors in each pair of the NMOS transistors are connected in series (with the source/drain terminals) between the horizontal conducting line 726 and the power rail 44. When each of the horizontal conducting lines 722 and 726 is connected to the vertical conducting line 776 through a corresponding via-connector VIA0, the drain terminals of the PMOS transistors T751$p$-T758 are connected to the drain terminals of the NMOS transistors T752$n$-T753$n$ and T756$n$-T757$n$.

The horizontal conducting line 724 is connected to each of the gate-conductors 751, 754, 755, and 758 through a corresponding via-connector VG and functions as a pin connector for the input signal "A2" of the NAND gate 700. When the vertical conducting line 774 is connected to the horizontal conducting line 724 through a via connector VIA0, the vertical conducting line 774 is configured to carry the input signal A2. The horizontal conducting line 725 is connected to each of the gate-conductors 752, 753, 756, and 757 through a corresponding via-connector VG and functions as a pin connector for the input signal A1 of the NAND gate 700. When the vertical conducting line 772 is connected to the horizontal conducting line 725 through a via connector VIA0, the vertical conducting line 772 is configured to carry the input signal A1. Furthermore, as the vertical conducting line 776 is connected to each of the horizontal conducting lines 722 and 726 through a via connector VIA0, the vertical conducting line 776 is configured to carry the output signal ZN of the NAND gate 700.

In FIG. 7, because the terminal-conductors 731$p$, 733$p$, 735$p$, 737$p$ and 739$p$ are source terminals of the PMOS transistors connecting to the power rail 42 and the terminal-conductors 731$n$, 735$n$, and 739$n$ are source terminals of the NMOS transistors connecting to the power rail 44, the widths of the terminal-conductors 731$p$, 733$p$, 735$p$, 737$p$ and 739$p$ and the widths of the terminal-conductors 731$n$, 735$n$, and 739$n$ are implemented to be larger than the widths of the other terminal-conductors in the circuit cell, whereby the speed performance of the NAND gate 700 is improved.

FIG. 8 is a flowchart of a method 800 of manufacturing an integrated circuit, in accordance with some embodiments. The sequence in which the operations of method 800 are depicted in FIG. 8 is for illustration only; the operations of method 800 are capable of being executed in sequences that differ from that depicted in FIG. 8. It is understood that additional operations may be performed before, during, and/or after the method 800 depicted in FIG. 8, and that some other processes may only be briefly described herein.

In operation 810 of method 800, a first-type active-region structure and a second-type active-region structure are fabricated on a substrate. In the example embodiments as shown in FIGS. 4A-4B and FIGS. 5A-5B, the active-region structure 80$p$ and the active-region structure 80$n$ are fabricated on the substrate 20. Each of the active-region structure 80$p$ and the active-region structure 80$n$ extends in the X-direction. Examples of the active-region structures fabricated in operation 810 include fin structures, nano-sheet structures, and nano-wire structures.

In operation 820 of method 800, a first gate-conductor intersecting the first-type active-region structure is fabricated. In the example embodiment as shown in FIGS. 4A-4B, the gate-conductor 455 intersecting the active-region structure 80$p$ is fabricated. In the example embodiment as shown in FIGS. 5A-5B, the gate-conductors 552, 554, 556, and 558 intersects the active-region structure 80$p$ are fabricated.

In operation 830 of method 800, a first terminal-conductor having a first width and a second terminal-conductor having a second width are fabricated. The first width is larger than the second width by a predetermined amount. In the example embodiment as shown in FIGS. 4A-4B, the terminal-conductors 432 and 438$p$ intersecting the active-region structure 80$p$ are fabricated, and the width of the terminal-conductor 418$p$ is larger than the width of the terminal-conductor 432. Each of the terminal-conductors 432 and 418$p$ is adjacent to the gate-conductor 455. In the example embodiment as shown in FIGS. 5A-5B, the terminal-conductors 532$p$, 535$p$, and 538$p$ intersecting the active-region structure 80$p$ and the terminal-conductors 534 and 536 intersecting the active-region structure 80$p$ are fabricated. Each of the terminal-conductors 532$p$, 535$p$, and 538$p$ has a width that is larger than the width of any of the terminal-conductors 534 and 536.

In operation 840 of method 800, a first via-connector in conductive contact with the first terminal-conductor is formed. In the example embodiment as shown in FIGS. 4A and 4C, a via-connector in conductive contact with the terminal-conductor 438$p$ is formed at the intersection between the power rail 42 and the terminal-conductor 438$p$. In the example embodiment as shown in FIG. 5A and FIG. 5C, via-connectors in conductive contact with the terminal-conductors 532$p$, 535$p$, and 538$p$ are fabricated at the corresponding intersection between the power rail 42 and the terminal-conductor the terminal-conductors 532$p$, 535$p$, and 538$p$.

In operation 850 of method 800, a first power rail intersecting the first terminal-conductor is fabricated and the first power rail is conductively connected to the first terminal-conductor through the first via-connector. In the example embodiment as shown in FIGS. 4A and 4C, the power rail 42 intersects the terminal-conductor 438$p$ and is fabricated and the power rail 42 is conductively connected to the terminal-conductor 438$p$ through a via-connector. In the example embodiment as shown in in FIGS. 5A and 5C, the power rail 42 intersects each of the terminal-conductors 532$p$, 535$p$, and 538$p$ and is fabricated and the power rail 42 is conductively connected to each of the terminal-conductors 532$p$, 535$p$, and 538$p$ through a corresponding via-connector.

Figure 9:
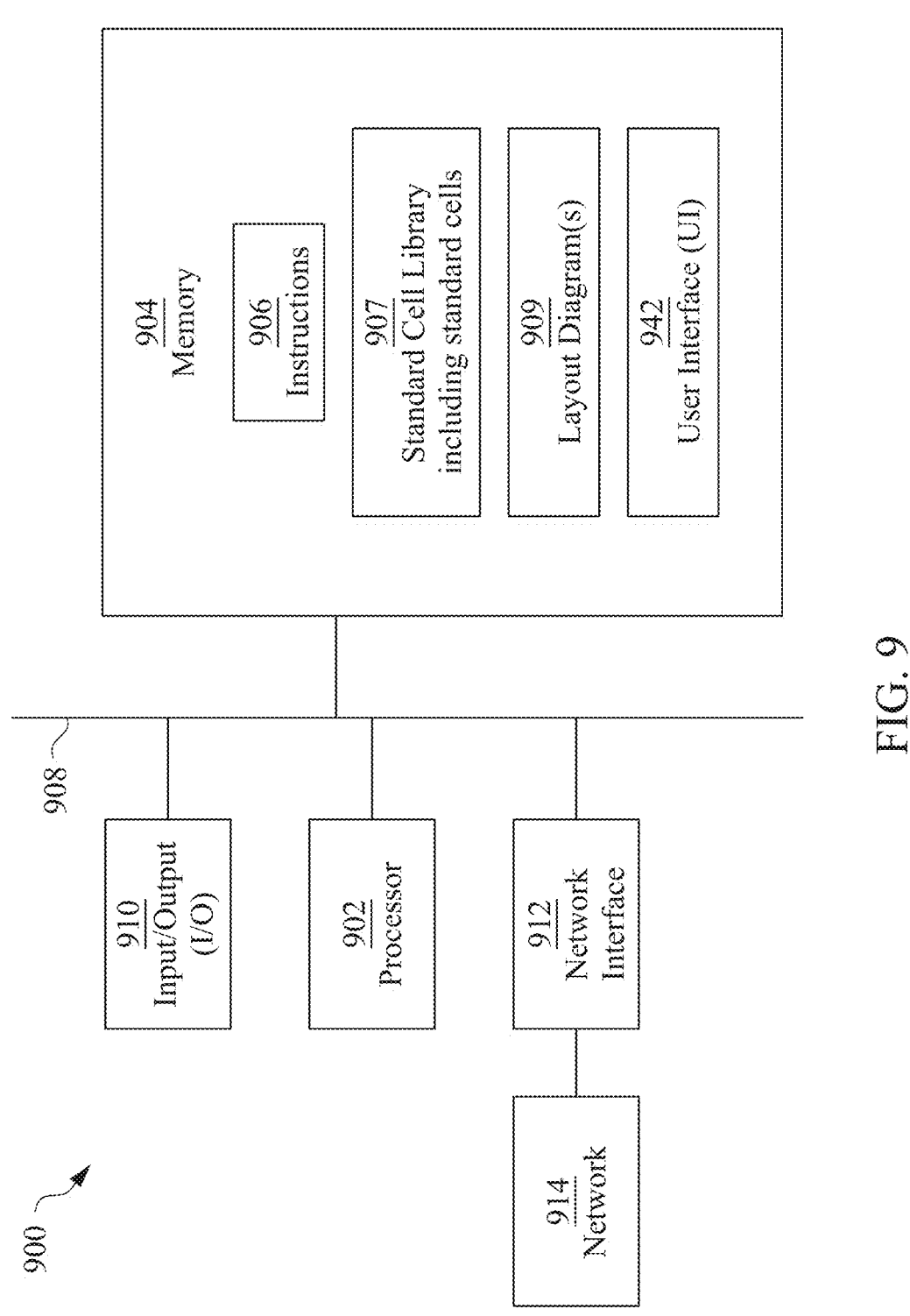
FIG. 9 is a block diagram of an electronic design automation (EDA) system in accordance with some embodiments.

FIG. 9 is a block diagram of an electronic design automation (EDA) system 900 in accordance with some embodiments.

In some embodiments, EDA system 900 includes an APR system. Methods described herein of designing layout diagrams represent wire routing arrangements, in accordance with one or more embodiments, are implementable, for example, using EDA system 900, in accordance with some embodiments.

In some embodiments, EDA system 900 is a general purpose computing device including a hardware processor 902 and a non-transitory, computer-readable storage medium 904. Storage medium 904, amongst other things, is encoded with, i.e., stores, computer program code 906, i.e., a set of executable instructions. Execution of instructions 906 by hardware processor 902 represents (at least in part) an EDA tool which implements a portion or all of the methods described herein in accordance with one or more embodiments (hereinafter, the noted processes and/or methods).

Processor 902 is electrically coupled to computer-readable storage medium 904 via a bus 908. Processor 902 is also electrically coupled to an I/O interface 910 by bus 908. A network interface 912 is also electrically connected to processor 902 via bus 908. Network interface 912 is connected to a network 914, so that processor 902 and computer-readable storage medium 904 are capable of connecting to external elements via network 914. Processor 902 is configured to execute computer program code 906 encoded in computer-readable storage medium 904 in order to cause system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores library 907 of standard cells including such standard cells as disclosed herein. In one or more embodiments, storage medium 904 stores one or more layout diagrams 909 corresponding to one or more layouts disclosed herein.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

EDA system 900 also includes network interface 912 coupled to processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 900.

System 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a UI through I/O interface 910. The information is stored in computer-readable medium 904 as user interface (UI) 942.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 10:
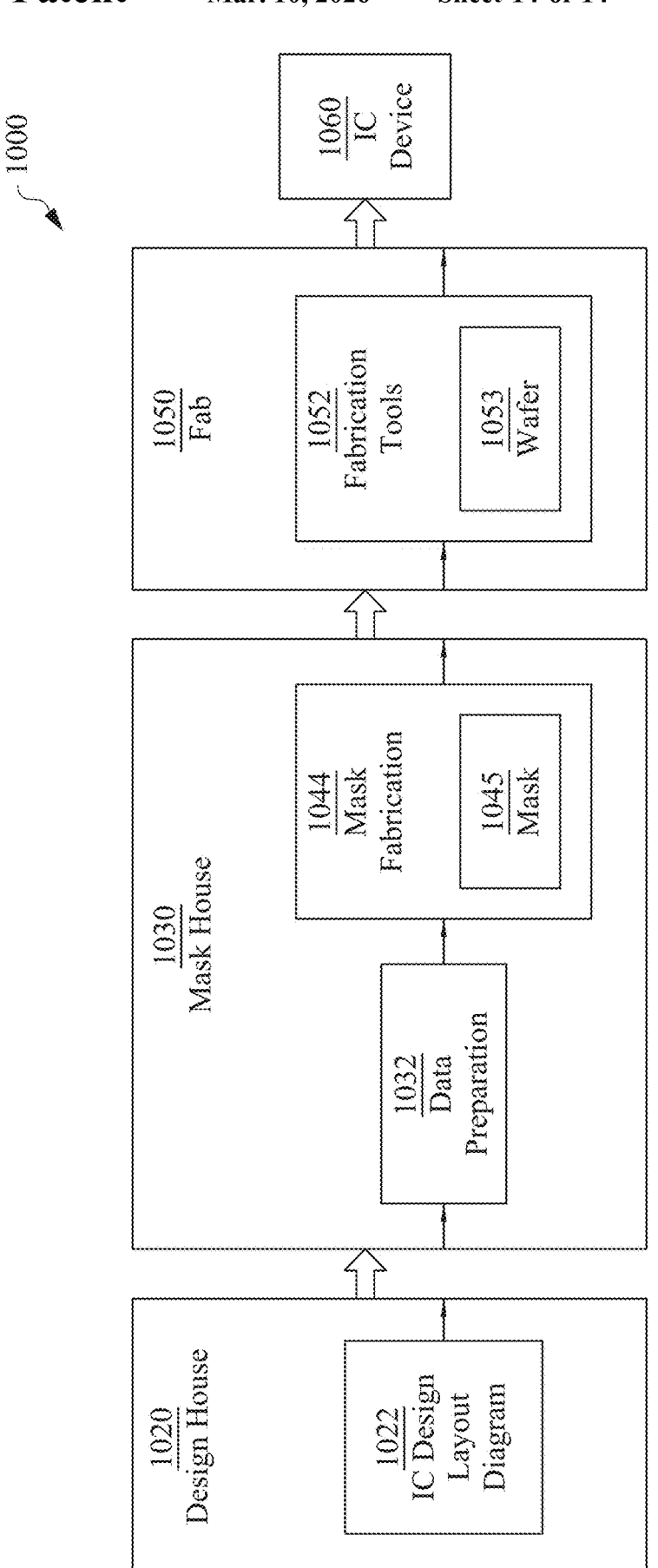
FIG. 10 is a block diagram of an integrated circuit (IC) manufacturing system, and an IC manufacturing flow associated therewith, in accordance with some embodiments.

FIG. 10 is a block diagram of an integrated circuit (IC) manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1000.

In FIG. 10, IC manufacturing system 1000 includes entities, such as a design house 1020, a mask house 1030, and an IC manufacturer/fabricator ("fab") 1050, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout diagram 1022. The design procedure includes one or more of logic design, physical design or place and route. IC design layout diagram 1022 is presented in one or more data files having information of the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The design layout diagram 1022 is manipulated by mask data preparation 1032 to comply with particular characteristics of the mask writer and/or requirements of IC fab 1050. In FIG. 10, mask data preparation 1032 and mask fabrication 1044 are illustrated as separate elements. In some embodiments, mask data preparation 1032 and mask fabrication 1044 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for limitations during mask fabrication 1044, which may undo part of the modifications performed by OPC in order to meet mask creation rules.

In some embodiments, mask data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

It should be understood that the above description of mask data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After mask data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (photomask or reticle) 1045 based on the modified IC design layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1050 includes fabrication tools 1052 configured to execute various manufacturing operations on semiconductor wafer 1053 such that IC device 1060 is fabricated in accordance with the mask(s), e.g., mask 1045. In various embodiments, fabrication tools 1052 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multi-level interconnects, and the like (formed at subsequent manufacturing steps).

An aspect of the present disclosure relates to an integrated circuit. The integrated circuit includes a first power rail and a second power rail extending in a first direction, and a first-type active-region structure and a second-type active-region structure extending in the first direction. The integrated circuit also includes a first terminal-conductor extending in a second direction perpendicular to the first direction, and a second terminal-conductor extending in the second direction. The first terminal-conductor intersects both the first-type active-region structure and the first power rail. The second terminal-conductor intersects the first-type active-region structure without intersecting the first power rail. The integrated circuit further includes a first gate-conductor extending in the second direction between the first terminal-conductor and the second terminal-conductor and intersecting the first-type active-region structure. The first gate-conductor is adjacent to the first terminal-conductor and the second terminal-conductor. A first width of the first terminal-conductor is larger than a second width of the second terminal-conductor by a predetermined amount.

Another aspect of the present disclosure also relates to an integrated circuit. The integrated circuit includes a power rail extending in a first direction, an active-region structure extending in the first direction, and two boundary isolation regions in the active-region structure. The integrated circuit also includes a plurality of terminal-conductors intersecting the active-region structure between the two boundary isolation regions. Each of the terminal-conductors extends in a second direction perpendicular to the first direction. At least one of the terminal-conductors has a first width and at least one of the terminal-conductors has a second width. A ratio between the first width and the second width is larger than or equal to a predetermined ratio. The integrated circuit further includes a plurality of gate-conductors extending in the second direction, and a plurality of via-connectors. At least one terminal-conductor that is conductively connected to the power rail through one of the via-connectors has the first width.

Another aspect of the present disclosure relates to a method. The method includes fabricating a first-type active-region structure and a second-type active-region structure, fabricating a first gate-conductor intersecting the first-type active-region structure, and fabricating a first terminal-conductor having a first width and a second terminal-conductor having a second width. Each of the first terminal-conductor and the second terminal-conductor is adjacent to the first gate-conductor and intersects the first-type active-region structure. The second width is smaller than the first width by a predetermined amount. The method also includes forming a second via-connector that is in conductive contact with the third terminal-conductor, and fabricating a second power rail intersecting the third terminal-conductor and conductively connected to the third terminal-conductor through the second via-connector.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a first power rail and a second power rail extending in a first direction;
   a first-type active-region structure and a second-type active-region structure extending in the first direction;
   a first terminal-conductor extending in a second direction perpendicular to the first direction, wherein the first terminal-conductor intersects both the first-type active-region structure and the first power rail;
   a second terminal-conductor extending in the second direction, wherein the second terminal-conductor intersects the first-type active-region structure without intersecting the first power rail;
   a first gate-conductor extending in the second direction between the first terminal-conductor and the second terminal-conductor and intersecting the first-type active-region structure, wherein the first gate-conductor is adjacent to the first terminal-conductor and the second terminal-conductor; and
   wherein a first width of the first terminal-conductor is larger than a second width of the second terminal-conductor by a predetermined amount.

2. The integrated circuit of claim 1, further comprising:
   a via-connector connecting the first terminal-conductor to the first power rail at an intersection between the first terminal-conductor and the first power rail.

3. The integrated circuit of claim 1, further comprising:
   a third terminal-conductor extending in the second direction, wherein the third terminal-conductor intersects both the second-type active-region structure and the second power rail; and
   wherein a third width of the third terminal-conductor is equal to the first width.

4. The integrated circuit of claim 3, wherein the third terminal-conductor is aligned with the first terminal-conductor along the second direction.

5. The integrated circuit of claim 3, further comprising:
   a via-connector connecting the third terminal-conductor to the second power rail at an intersection between the third terminal-conductor and the second power rail.

6. The integrated circuit of claim 3, wherein the first gate-conductor further intersects the second-type active-region structure, and the first gate-conductor is adjacent to the third terminal-conductor.

7. The integrated circuit of claim 3, further comprising:
   a second gate-conductor extending in the second direction and intersecting the second-type active-region structure, wherein the second gate-conductor is adjacent to the third terminal-conductor.

8. The integrated circuit of claim 1, further comprising:
   a fourth terminal-conductor extending in the second direction, wherein the fourth terminal-conductor intersects the second-type active-region structure without intersecting the second power rail; and
   wherein a fourth width of the fourth terminal-conductor is equal to the second width.

9. The integrated circuit of claim 8, wherein the fourth terminal-conductor is aligned with the second terminal-conductor along the second direction.

10. The integrated circuit of claim 1, wherein the first width is larger than the second width by at least 20%.

11. The integrated circuit of claim 1, wherein the first width is larger than the second width by at least 10%.

12. An integrated circuit comprising:

a power rail extending in a first direction;

an active-region structure extending in the first direction;

two boundary isolation regions in the active-region structure;

a plurality of terminal-conductors intersecting the active-region structure between the two boundary isolation regions, wherein each of the terminal-conductors extends in a second direction perpendicular to the first direction, and wherein at least one of the terminal-conductors has a first width and at least one of the terminal-conductors has a second width, and wherein a ratio between the first width and the second width is larger than or equal to a predetermined ratio;

a plurality of gate-conductors extending in the second direction; and a plurality of via-connectors, wherein at least one terminal-conductor that is conductively connected to the power rail through one of the via-connectors has the first width.

13. The integrated circuit of claim 12, where at least one of the gate-conductors is adjacent to a first terminal-conductor having the first width and a second terminal-conductor having the second width.

14. The integrated circuit of claim 12, wherein the two boundary isolation regions are at vertical boundaries of a circuit cell.

15. The integrated circuit of claim 12, wherein the ratio between the first width and the second width is at least 1.20.

16. The integrated circuit of claim 12, wherein the ratio between the first width and the second width is at least 1.10.

17. An integrated circuit comprising:

a first power rail extending in a first direction;

a first-type active-region structure extending in the first direction;

a first terminal-conductor extending in a second direction perpendicular to the first direction, wherein the first terminal-conductor intersects both the first-type active-region structure and the first power rail;

a second terminal-conductor extending in the second direction, wherein the second terminal-conductor intersects the first-type active-region structure without intersecting the first power rail;

a first gate-conductor extending in the second direction between the first terminal-conductor and the second terminal-conductor and intersecting the first-type active-region structure, wherein the first gate-conductor is adjacent to the first terminal-conductor and the second terminal-conductor; and wherein a first width of the first terminal-conductor is larger than a second width of the second terminal-conductor by a predetermined amount.

18. The integrated circuit of claim 17, further comprising:

a via-connector connecting the first terminal-conductor to the first power rail at an intersection between the first terminal-conductor and the first power rail.

19. The integrated circuit of claim 17, further comprising:

a second gate-conductor extending in the second direction and intersecting the first-type active-region structure, wherein the first terminal-conductor is adjacent to the first gate-conductor and adjacent to the second gate-conductor.

20. The integrated circuit of claim 17, further comprising:

a second gate-conductor extending in the second direction and intersecting the first-type active-region structure, wherein the second terminal-conductor is adjacent to the first gate-conductor and adjacent to the second gate-conductor.

* * * * *